US 6,718,094 B1

(12) United States Patent
Devaux et al.

(10) Patent No.: US 6,718,094 B1
(45) Date of Patent: Apr. 6, 2004

(54) LARGE SURFACE AMPLIFIER WITH MULTIMODE INTERFEROMETER

(75) Inventors: Fabrice Devaux, Marlrouge (FR); Eric Vergnol, Antony (FR)

(73) Assignee: Avanex Corporation, Fremont, CA (US)

( * ) Notice: Subject to any disclaimer, the term of this patent is extended or adjusted under 35 U.S.C. 154(b) by 0 days.

(21) Appl. No.: 09/508,340

(22) PCT Filed: Sep. 11, 1998

(86) PCT No.: PCT/FR98/01954

§ 371 (c)(1),
(2), (4) Date: May 25, 2000

(87) PCT Pub. No.: WO99/14623

PCT Pub. Date: Mar. 25, 1999

(30) Foreign Application Priority Data

Sep. 12, 1997 (FR) ................................ 97 11391

(51) Int. Cl.⁷ ................................................ G02B 6/26
(52) U.S. Cl. ............................ 385/39; 385/43; 385/50; 385/132
(58) Field of Search ................. 385/27–30, 39–50, 385/131, 132; 372/50

(56) References Cited

U.S. PATENT DOCUMENTS

| | | | |
|---|---|---|---|
| 4,087,159 A | | 5/1978 | Ulrich |
| 5,228,049 A | * | 7/1993 | Paoli ........................... 372/50 |
| 5,513,196 A | * | 4/1996 | Bischel et al. ................ 372/22 |
| 5,608,572 A | * | 3/1997 | Nitta et al. ................... 359/344 |
| 5,689,597 A | * | 11/1997 | Besse ........................... 385/39 |
| 5,838,853 A | * | 11/1998 | Jinnai et al. .................. 385/50 |
| 5,894,492 A | * | 4/1999 | Welch et al. ................. 372/50 |
| 5,917,972 A | * | 6/1999 | Davies ......................... 385/43 |
| 6,148,132 A | * | 11/2000 | Hamamoto ................. 385/131 |

FOREIGN PATENT DOCUMENTS

| | | | |
|---|---|---|---|
| JP | 02-241644 A | * | 9/2000 |
| WO | WO 95/02264 | | 1/1995 |
| WO | WO 96/ 08044 | | 1/1995 |

OTHER PUBLICATIONS

R. M. Jenkins et al., 1–N–Way Phased Array Resonator, Conference on Lasers and Electro–Optics, vol. 8, Jan. 1, 1994, p. 228.
K. Hamamoto et al, Single Transverse Mode Active Multi-mode Interferometer In GaAsP/InP Laser Diode, Electronic Letters, vol. 34, No. 5, Mar. 5, 1998, pp. 462–464.
P. A. Besse et al, Journal of Lightwave Technology, vol. 14, No. 10, Oct. 1996, p. 2290.
L. B. Soldano et al, Journal of Lightwave Technology, vol. 13, No. 4, Apr. 1995, p. 615.
K. Hamamoto, EICO'97, Apr. 2–4, 1997.
Y. Suematsu et al, Handbook of Semiconductor Lasers and photonic integrated Circuits, 1994, chapter 13, pp. 428–458.

* cited by examiner

Primary Examiner—Hemang Sanghavi
(74) Attorney, Agent, or Firm—Wilson Sonsini Goodrich & Rosati; Kenta Suzue

(57) ABSTRACT

A Multi-mode Interferometric coupler comprising:
  a first amplifying part (2),
  a second transparent part (4) to guide radiation previously amplified in the first part.

9 Claims, 3 Drawing Sheets

LARGE SURFACE AMPLIFIER WITH MULTIMODE INTERFEROMETER

TECHNICAL DOMAIN AND PRIOR ART

This invention relates to a multi-mode interferometric coupler (MMI coupler), for example for use in a semiconductor amplifier for telecommunications.

The coupler according to the invention may be used for the manufacture of optical components on an InP or AsGa semiconductor (laser, laser modulator, etc.).

One example application is the manufacture of an amplifier outputting an optical power greater than a standard semiconductor amplifier.

Another example application relates to all transmission systems in which a very linear amplifier is necessary.

Multi-mode couplers, and their application to integrated optics, are already known in prior art; examples of couplers and their applications are given in articles by L. B. SOLDANO, Journal of Lightwave Technology, vol. 13, No.4, page 615, 1995 and in the article by P. A. BESSE, Journal of Lightwave Technology, vol. 14, No. 10, page 2290, 1996.

In the field of semiconductor amplifiers, there are standard semiconductor amplifiers and wide area semiconductor amplifiers.

The typical component of a standard semiconductor amplifier is a single mode wave guide on semiconductor, with a core containing a laser type material. When a current is injected, the material introduces a gain and the lightwave is amplified.

FIGS. 1A and 1B show the variation of the total power and the maximum power respectively, in the same section of this type of standard semiconductor amplifier. In the example given, a light power of −25 dBm is injected, and the total output power is 0 dBm. The maximum power varies in the same way.

Wide area amplifiers can increase the output power of the device by ensuring that the maximum power density does not reach the saturation power level. This saturation power is fixed only by the material and the current. The wave guide is gradually widened to achieve this. Although the wave guide becomes multi-mode, the lightwave remains coupled with the main mode and gradually widens.

The result is that the gain remains the same (25 dB) but the saturation power increases by about 7 dB. FIGS. 2A and 2B show the variation of the total power and the maximum power respectively, in the same section of a wide area semiconductor amplifier.

This type of device has two disadvantages:
(i) it is difficult to couple output light in a single mode wave guide or in an optical fiber,
(ii) the structure is potentially unstable with respect to a local power modification inducing a variation in the index, which induces coupling of the wave in a higher mode, and another local power modification, etc.

Finally, the paper by K. HAMAMOTO published in EICO '97, on Apr. 2–4 1997, Stockholm, describes an MMI in which all the active material in the coupler is an amplifier.

DESCRIPTION OF THE INVENTION

Compared with these known devices, the multi-mode interferometric coupler according to the invention comprises two parts, one amplifying part and one part made of a transparent material, which guides the radiation amplified in the first part.

The structure according to the invention can be used to make an amplifier with approximately the same gain and the same saturation power as a wide area amplifier. It also enables coupling of all amplified light in a single mode guide, with minimum losses. Finally, the multi-mode interferometric coupler according to the invention does not have the instability characteristic of a wide area amplifier since, due to its multi-mode nature, the invention is not very sensitive to a fluctuation in the index.

Compared with the device described in the article by K. Hamamoto mentioned above, only part of the multi-mode. coupler is used as an amplifier. In the first part of the MMI according to the invention, the optical power is deconcentrated and therefore it is advantageous to amplify the radiation in it. In the second part of the MMI according to the invention, the optical power is concentrated, for example on an output guide, and it is important that it should not be amplified to avoid saturating the amplifier. Therefore, the Hamamoto device does not take advantage of selective amplification in areas in which the optical power is low, unlike the device according to this invention.

Furthermore, the device described by Hamamoto does not use any part made of transparent material, but is simply an amplification device.

A single mode guide may be placed at the output from the coupler according to the invention.

Furthermore, the amplifying material may be a structure embedded in an InP substrate.

The amplifying material may be a laser material, for example a quaternary InGaAsP alloy. This material may also have quantic wells.

The invention also relates to an optical amplifier comprising an optical preamplifier and a coupler according to the invention described above.

The invention also relates to a number of processes:
to amplify the power of a light source,
or to compensate for the losses of an optical fiber,
or to amplify signals multiplexed in wave length, these various processes making use of a coupler or an optical amplifier according to the invention.

BRIEF DESCRIPTION OF THE FIGURES

In any case, the characteristics and advantages of the invention will become clear when reading the following description. This description relates to non-restrictive example embodiments given for explanatory purposes only with reference to the attached drawings in which.

DETAILED PRESENTATION OF EMBODIMENTS OF THE INVENTION

Figure 1A:
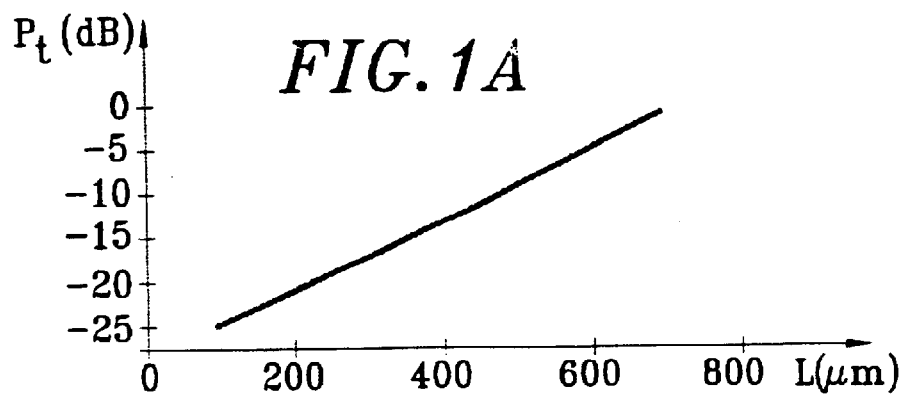
FIGS. 1A and 1B show the variation in the total power and the maximum power in the same section of a standard semiconductor amplifier.
Figure 1B:
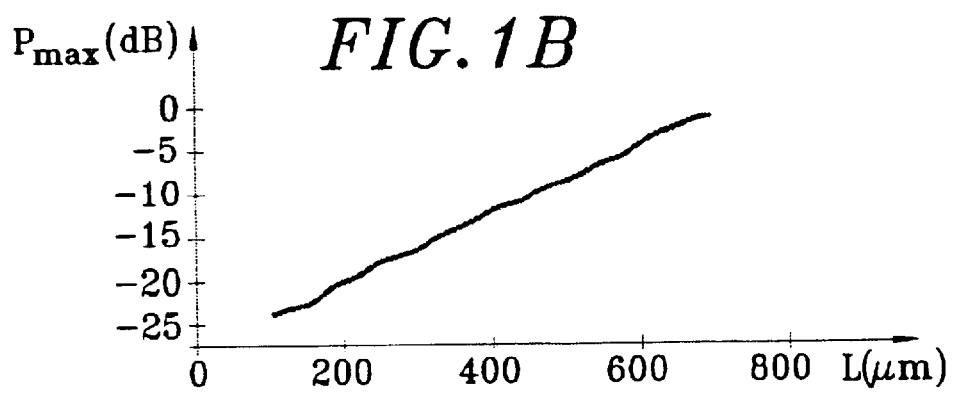
Figure 2A:
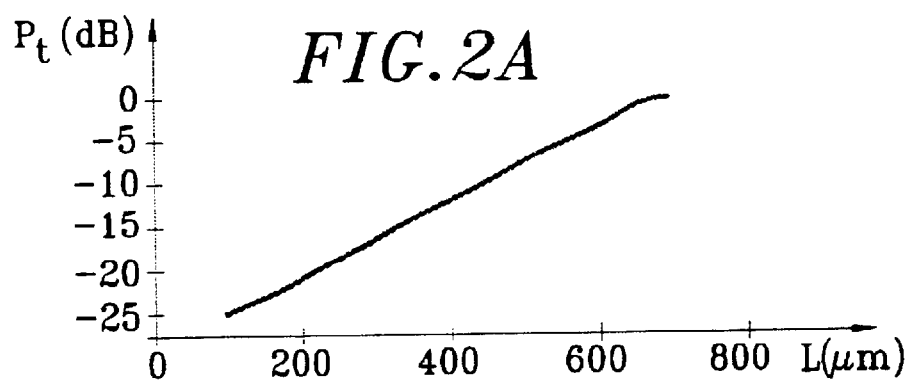
FIGS. 2A and 2B show the variation of the total power and the maximum power in the same section of a wide area semiconductor amplifier.
Figure 2B:
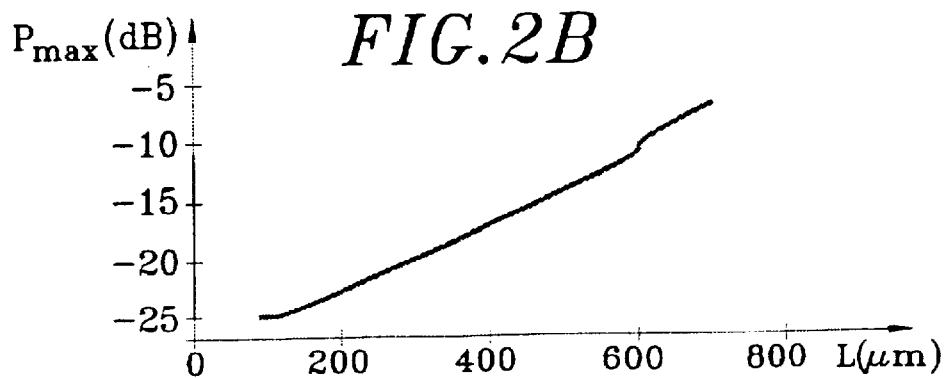
Figure 3:
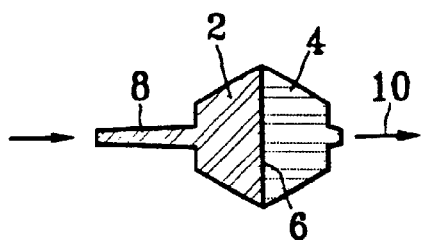
FIG. 3 shows the structure of a coupler according to the invention.

FIG. 3 diagrammatically shows the structure of a coupler according to the invention. A first part 2 is composed of an amplifying material and is followed by part 4 made of a transparent passive material. In fact, the first part forms an amplifying area (which is typically composed of a laser material) and the second part is a multi-mode guide area composed of a guide material or a laser material-polarized to transparency.

The amplifying area and the guide area are laid out to be perpendicular or almost perpendicular to the direction of propagation of incident light 8, and light output from the coupler, to avoid disturbing the coupler's properties.

The device that has been described above is different from other devices with wave guides such as "tapers" or lenses, in that it is composed of a structure with multi-mode guided waves. The incident lightwave is actually coupled on most coupler modes.

Preferably, the shape of the coupler is chosen such that the input light field is reproduced at the output at one or several locations, with attenuation and a variable phase shift. The conditions necessary to achieve this result are described in the article by L. B. SOLDANO, mentioned above in the introduction to this application.

Figure 4A:
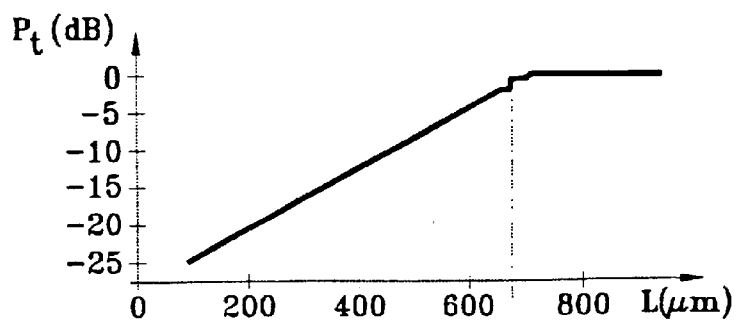
FIGS. 4A and 4B show the variation of the total power and the maximum power respectively, in the same section of a coupler according to the invention, FIG. 5 diagrammatically shows a 1×1 type coupler according to the invention.
Figure 4B:
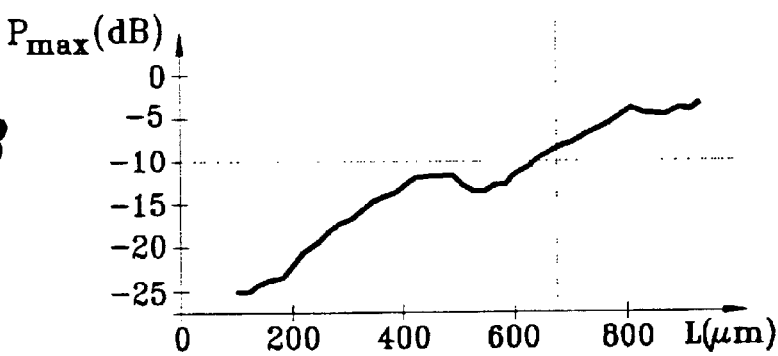

FIGS. 4A and 4B show the total power and the maximum power respectively, for a section of a coupler according to the invention, during propagation. In these two figures, the vertical line shows the end of the amplifying structure, or the boundary area 6, between the amplifying structure and the guide material. These figures show that the gain remains equal to 25 dB but that the maximum power is −10 dBm instead of 0 dBm for a standard structure. Therefore, the saturation power is 10 dB higher. Furthermore, light may well be recoupled in a single mode wave guide. The coupler according to the invention does not have the instability characteristic of the wide area amplifier since, due to its multi-mode nature, the coupler according to the invention is not very sensitive to an index fluctuation.

Figure 5:
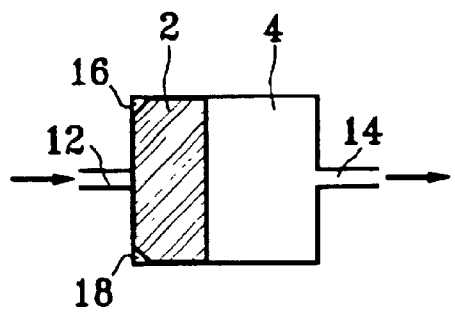

FIG. 5 shows an example of a 1×1 coupler, in other words a coupler with an input guide 12 and an output guide 14. Part 2 of the coupler according to the invention is used as an amplifier. The interface between the amplifying medium and the guided area 4 may be vertical. But it may also be slightly inclined (for example at an angle of 2 to 8°) from the vertical, in order to avoid reflection problems. The first two corners 16, 18 of the coupler are not necessarily made of an amplifying material since light does not reach these regions.

Figure 6A:
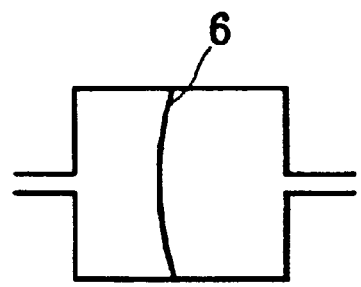
FIGS. 6A to 6D show various boundary shapes between the two parts of a coupler according to the invention.
Figure 6B:
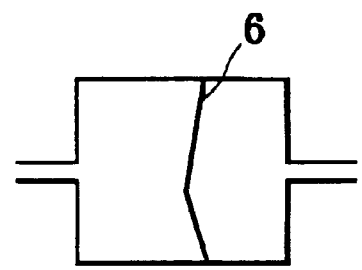
Figure 6C:
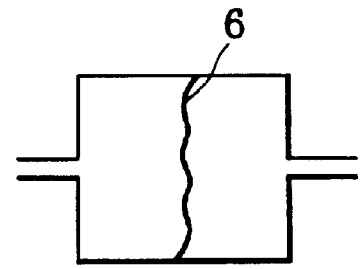
Figure 6D:
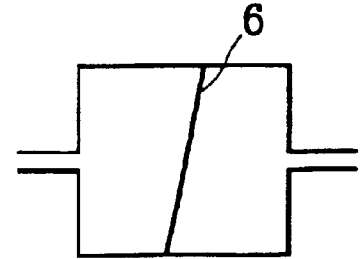

Other examples of coupler structures according to the invention, and particularly interface couplers between the amplification and guide areas, are shown in FIGS. 6A to 6D. FIG. 6A shows a slightly curved interface area 6. FIG. 6B shows a "V" shaped interface area. In FIG. 6C, it is in the shape of "zigzag". Finally, FIG. 6B shows an example of a coupler with an interface inclined from the trajectory of incident and emitted beams, or with respect to the vertical (for example with an angle of about 2 to 10° from the vertical).

For example, the amplifying material of a coupler according to the invention may be composed of a structure embedded in InP, an InGaAsP quaternary laser, or quantic wells, with the electrodes and doping system typical of an amplifier, as described in the article by L. B. SOLDANO et al mentioned above. The transparent area may be composed of the same material polarized at a different current, or an InGaAsP material, or quantic energy wells with higher prohibited bands.

Manufacturing techniques for a coupler according to the invention make use of techniques known in prior art. For example, these techniques are described in the book by Y. SUEMATSU et al, entitled "Handbook of semiconductor lasers and photonic integrated circuits", chapter 13, pages 428–458 Chapman & Hall, 1994. Therefore, a structure according to the invention is made using standard wave guide manufacturing methods: embedded ribbon, ribbon at edge, charged ribbon, etc. The amplifier technology is standard (pin structure embedded or at edge). "Butt-coupling" type, selective epitaxy or evanescent coupling integration techniques may be used.

Figure 7:
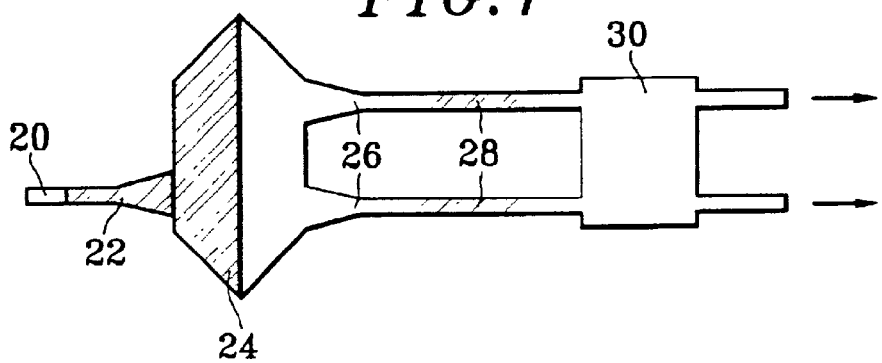
FIG. 7 shows an example of how a coupler according to the invention may be used in an integrated device.

FIG. 7 shows an example of how the invention is used in an integrated device, for example in an InP semiconductor. In this device, the first coupler (for example at 3 dB) of a Mach-Zehnder type device is replaced by a coupler according to the invention. The device shown in FIG. 7 comprises (in order from left to right) an input guide 20, an input amplifier 22 (carrying out a pre-amplification step), a coupler 24 according to the invention (in this case a 1×2 diamond shaped coupler with an unequal distribution rate, with one half amplified), two output guides 26, two standard amplifiers 28 and a standard 2×2 coupler 30.

Another example application of the invention is to make an amplifier outputting an optical power higher than a standard semiconductor amplifier. The device according to the invention can then be used as a discrete component, or it may be integrated with other functions on a semiconductor substrate. For example, the device according to the invention may be placed at the output from a laser modulator to increase the optical power level.

In this application, the incident power is already high compared with the pre-amplification function for which the incident power is low. Therefore, the objective of this type of application is to be able to output a high optical power. This type of device can be used in optical telecommunications, for example behind a light source to increase its power level. It may also be used in line to compensate for losses in an optical fiber. In both cases, the advantage of the invention compared with a fiber amplifier doped with erbium (which is traditionally used) is that the amplifier according to the invention may be integrated monolithically with the source in order to form a compact component.

Another example application relates to transmission systems in which a very linear amplifier is necessary. For example, the amplification of signals multiplexed in wave length requires a very linear amplifier to prevent crosstalk between channels. However, semiconductor amplifiers quickly become non-linear; their gain drops above a given optical power level. In this case, the transmission of the device depends on the incident power level, which is the definition of the non-linearity. This may cause various problems in the deformation of optical signals. For example, if an incident signal is composed of lightwaves with several wave lengths, as the light passes through a non-linear device it will cause crosstalk between the various channels. A more linear amplifier could reduce the magnitude of this problem. A typical example is a multi-wave length monolithically integrated source. The device according to the invention can act as an integrated amplifier to increase the output power level.

Another example is an integrated in-line filter device, in which the signal is processed (for filtering and modulation)

with optical losses. In this case, adding an amplifier according to the invention can increase the power level without distortion.

Another example is the use of the amplifier to generate the optical signal by spectral turning of the optical field. This is done using the properties of the mix with four semiconductor amplifier waves (for example see the article by T. Ducellier et al entitled "Study of optical phase conjugation in bulk travelling wave semiconductor optical amplifier", published in the IEEE Photonics Technology Letters, vol. 8(4), p. 530 (1996)). A very linear amplifier according to this invention behaves better in this operation than a conventional semiconductor amplifier, and therefore can advantageously replace it. The efficiency of the mix with four waves is greater when the output power is high, which can be achieved using the amplifier according to the invention.

According to another example, wave length converters are integrated devices including several optical elements such as wave guides, Y-junctions, couplers, semiconductor amplifiers. Very high optical powers are necessary to use them, which is not very practical. Therefore, the invention can advantageously be used as an integrated amplifier by using the same materials as the amplifiers already present on the chip (which are used in this device in any case for their non-linear properties). Due to the different geometry, the same amplifying layer is used as a non-linear or a linear amplifier, which facilitates manufacturing.

What is claimed is:

1. An interferometric coupler for controlling radiation proceeding therethrough, the coupler comprising:
    at least one input for conveying radiation incident to the coupler,
    at least one output for conveying radiation from the coupler,
    a first amplifying part (2) for amplifying the incident radiation, and
    a second transparent part (4) to guide radiation previously amplified in the first part;
    wherein the first and second parts are separated by a curved interface (6).

2. An interferometric coupler for controlling radiation proceeding therethrough, the coupler comprising:
    at least one input for conveying radiation incident to
    at least one output for conveying radiation from the coupler,
    a first amplifying part (2) for amplifying the incident radiation, and
    a second transparent part (4) to guide radiation previously amplified in the first part; wherein the first and second parts are separated by a V-shaped interface (6).

3. An interferometric coupler for controlling radiation proceeding therethrough, the coupler comprising:
    at least one input for conveying radiation incident to the coupler,
    at least one output for conveying radiation from the coupler,
    a first amplifying part (2) for amplifying the incident radiation, and
    a second transparent part (4) to guide radiation previously amplified in the first part; wherein the first and second parts are separated by a zigzag shaped interface (6).

4. An interferometric coupler for controlling radiation proceeding therethrough, the coupler comprising:
    at least one input for conveying radiation incident to the coupler,
    at least one output for conveying radiation from the coupler,
    a first amplifying part (2) for amplifying the incident radiation, and
    a second transparent part (4) to guide radiation previously amplified in the first part; wherein the first and second parts are separated by an inclined interface (6) on a path of input (8) and output (10) rays.

5. The coupler according to any of claims 1–4, wherein a signal mode guide is placed at the output.

6. An optical amplifier comprising:
    an optical pre-amplifier, and
    a coupler according to one of claims 1–4

7. Process for amplifying the power of a light source emitting radiation, consisting of placing a coupler according to any of claims 1–4, in the path of the said radiation.

8. Process to compensate for losses in an optical fiber consisting of placing a coupler according to any one of claims 1–4, in the path of radiation passing through the optical fiber.

9. Process for amplification of signals multiplexed in wave length, consisting of increasing the output power using a coupler according to one of claims 1–4.

* * * * *